United States Patent
Aydelott

(10) Patent No.: US 6,179,914 B1
(45) Date of Patent: Jan. 30, 2001

(54) DOPANT DELIVERY SYSTEM AND METHOD

(75) Inventor: Richard M. Aydelott, Ridgefield, WA (US)

(73) Assignee: SEH America, Inc., Vancouver, WA (US)

(*) Notice: Under 35 U.S.C. 154(b), the term of this patent shall be extended for 0 days.

(21) Appl. No.: 09/241,874

(22) Filed: Feb. 2, 1999

(51) Int. Cl.$^7$ .................................................. C30B 35/00
(52) U.S. Cl. ..................... 117/200; 117/206; 117/208; 117/214
(58) Field of Search ..................... 117/200, 206, 117/208, 214, 900, 912, 13, 19, 21, 20, 73

(56) References Cited

U.S. PATENT DOCUMENTS

| | | | |
|---|---|---|---|
| 2,944,875 | * 7/1960 | Leverton | 23/273 |
| 5,080,873 | * 1/1992 | Ono et al. | 422/249 |
| 5,242,531 | 9/1993 | Klingshirn et al. | 157/620.4 |
| 5,314,667 | * 5/1994 | Lim et al. | 117/216 |
| 5,360,480 | * 11/1994 | Altekruger | 117/214 |
| 5,373,805 | * 12/1994 | Takano et al. | 117/18 |
| 5,406,905 | 4/1995 | Yamane-Berhane et al. | 117/19 |
| 5,427,056 | * 6/1995 | Imai et al. | 117/214 |
| 5,492,078 | * 2/1996 | Altekruger et al. | 117/19 |
| 5,700,321 | * 12/1997 | Niikura | 117/19 |

FOREIGN PATENT DOCUMENTS 59156993   6/1984   (JP) .............................. C30B/15/04

* cited by examiner

*Primary Examiner*—Benjamin L. Utech
*Assistant Examiner*—Matthew Anderson
(74) *Attorney, Agent, or Firm*—Alston & Bird LLP

(57) ABSTRACT

A time-released dopant delivery system and method are provided in a Czochralski-type crystal-growing furnace to enable continuous doping of the melt over time. The dopant delivery system and method adjusts dopant levels within the melt as a function of time such that a controlled amount of dopant and, more typically, a substantially constant amount of dopant can be incorporated into the ingot over its length. By controlling the doping level in the ingot, the resistivity profile of the ingot can also be controlled over its length. In order to provide controlled dopant delivery, the dopant delivery system generally includes a vessel defining an internal cavity within which the dopant is disposed and an orifice through which the dopant, typically a molten dopant, is released. The dopant delivery system can also include means for submerging the vessel within the melt such that heat from the melt melts and therefore releases the dopant into the melt. Alternatively, the vessel can be at least partially defined by the crucible so as to be disposed within the melt. By properly configuring the orifice defined by the vessel, however, the release of dopant into the melt can be regulated.

10 Claims, 5 Drawing Sheets

DOPANT DELIVERY SYSTEM AND METHOD

FIELD OF THE INVENTION

The present invention relates generally to the growth of doped semiconductor crystals and, more particularly, to the controlled delivery of dopant to a molten host material contained within a melt crucible in a crystal-growing furnace.

BACKGROUND OF THE INVENTION

Current methods of growing single crystal ingots in a Czochralski-type crystal-growing furnace typically involve melting a polycrystalline host material, such as silicon, and a measured amount of dopant together in a crucible to create a melt. Once the melt is prepared, a seed crystal is lowered into contact with the melt to begin the crystal-growing process. As the seed crystal is slowly extracted from the melt, a monocrystalline crystal or ingot is drawn from the melt. Unfortunately, the monocrystalline ingot does not necessarily include a proportionate share of the dopant in the melt. Instead, the percentage of dopant incorporated into the monocrystalline ingot depends on the applicable segregation coefficient and other parameters.

Typically, the ingot incorporates a smaller percentage of the dopant than the melt. As such, the dopant concentration in the melt will increase over the crystal-growing period as the ingot is drawn from the melt. Due to the increasing dopant concentration in the melt, the ingot will also gradually incorporate a larger amount of dopant as the growth process proceeds. Since the resistivity of the ingot is a function of the amount of incorporated dopant, ingots that incorporate a increasing amount of dopant over their length also have a resistivity that decreases over their length. As a result, the wafers into which an ingot is sliced will also have slightly different resistivities depending upon the relative lengthwise location from which each wafer was sliced. Since purchasers of the wafers typically specify an acceptable range of resistivity values depending upon the intended use of the wafer, only a subset of the wafers harvested from an ingot may satisfy the requirements imposed by a purchaser.

U.S. Pat. No. 5,406,905 to Yemane-Berhane et al. discloses a technique for doping the melt after the host material has been melted in the crystal-growing furnace. This technique involves casting the dopant around the seed crystal used to grow the ingot. When the furnace is prepared, the dopant-coated seed crystal is held in a relatively cool part of the furnace until the host material has melted and is ready for doping. The dopant-coated seed crystal is then lowered to a position just above the melt. Heat transferred from the melt to the dopant-coated seed crystal causes the dopant, in solid form, to slip off the seed crystal and into the melt, hopefully without splashing and without immersing the seed crystal in the melt.

However, the '905 Yemane-Berhane et al. patent does not address the problems associated with variations in the concentration of the dopant throughout the course of drawing an ingot from the melt. Instead, when the temperature of the seed crystal rises due to the heat from the melt, a point is attained where the dopant will slide off the seed. Here, all of the dopant is delivered to the melt before the seed crystal is immersed in the melt to begin the ingot growing process. Thus, this technique is still prone to the problem of the conventional techniques wherein, as the crystal is grown, the concentration of the dopant in the melt will continually change, thereby altering the resistivity profile of the ingot in a lengthwise direction.

U.S. Pat. No. 5,242,531 to Klingshirn et al. discloses a process for continuously recharging a melt crucible with additional molten host material and additional molten dopant. In this regard, the Klingshirn '531 et al. patent describes separate containers filled with the host material and the dopant that are positioned above the melt crucible. Feedlines connect the containers with an additional crucible or container in which the host material and the dopant are mixed and melted. This additional crucible includes an outlet for supplying additional molten semiconductor material to the melt in order to recharge the melt during the crystal-growing process. While the '531 Klingshirn et al. patent addresses some of the issues with respect to controlling the amount of dopant in the melt throughout the course of a crystal-growing process, the technique described by the '531 Kingshirn et al. patent requires multiple containers positioned above the melt crucible which may complicate the design of the crystal-growing furnace and limit access to the melt crucible during the crystal-growing process.

Therefore, a need still exists for improved techniques of controlling the amount of dopant in the melt throughout the course of the crystal-growing process without requiring significant modifications to the crystal-growing furnace and without incurring the attendant costs. Consequently, a need still exists for improved techniques for controlling the concentration of dopant incorporated into the ingot over the length of the ingot, thereby also permitting the resistivity of the resulting wafers to be controlled.

SUMMARY OF THE INVENTION

The dopant delivery apparatus and associated method of the present invention effectively control the amount of dopant in the melt throughout the course of a crystal-growing process such that the concentration of dopant incorporated into the resulting ingot can be controlled over the length of the ingot. As such, the resistivity of the resulting wafers is also controlled, thereby overcoming the shortcomings of conventional crystal-growing processes. According to the present invention, an apparatus is provided for controllably delivering dopant to a melt which includes a vessel disposed in the melt and defining an interior cavity for containing the dopant. The vessel also defines at least one output orifice through which molten dopant is released into the melt, albeit at a release rate limited by the configuration of the output orifice. By regulating the release rate of the molten dopant into the melt, the dopant delivery apparatus precisely controls the overall concentration of dopant during the course of the crystal-growing process. In this fashion, the concentration of dopant incorporated into the ingot is also controlled over the length of the ingot such that the resulting wafers can have precisely defined resistivity characteristics.

In one embodiment, the dopant delivery apparatus is a submergible vessel having a housing defining the interior cavity and the orifice through which the molten dopant is released into the melt. The submergible vessel of this embodiment also includes means for submerging the housing within the melt. For example, the means for submerging the housing can include a weight positioned within the housing. In one advantageous embodiment, the housing is a capsule having a substantially cylindrical body and two opposed closed ends. According to this embodiment, one of the enclosed ends is weighted such that the capsular housing stands substantially vertical when immersed in the melt. According to another embodiment, the housing of the submergible vessel is a truncated capsule having an open end and an opposed closed end. According to this embodiment, the closed end is weighted such that the truncated capsular housing stands substantially vertical when immersed in the melt. As such, the open end of the truncated capsular housing serves as the orifice through which the molten dopant is released. The truncated capsular housing can also include baffles affixed to an interior surface of the housing and extending into the interior cavity for controlling the mixing of the melt with the dopant.

According to another embodiment, the vessel is not only submerged within the melt, but is secured within the melt crucible. More particularly, the vessel can be at least partially defined by the melt crucible, preferably in a position that is aligned with the crystal drawn from the melt. The vessel of this embodiment can also include a lid which is removably attached to the melt crucible so as to cover the portion of the vessel defined by the melt crucible. Preferably, the lid defines at least one output orifice that is sized to regulate the release rate of the dopant.

In operation, dopant is disposed within the vessel, typically in a solid form. As described above, the vessel is positioned within the melt to operatively enable release of the dopant through the output orifice and into the melt. In one embodiment, for example, the vessel is positioned in an aligned relationship with respect to the crystal drawn from the melt. In any event, the heat from the melt melts the dopant which is thereafter released through the orifice defined by the vessel. In particular, a portion of the melt generally enters the vessel and becomes supersaturated with dopant such that the subsequent release of the supersaturated melt from the vessel through the output orifice controllably dopes the remainder of the melt. In order to grow ingots that include precise concentrations of two or more dopants, the dopant delivery apparatus and method of the present invention can include two or more vessels positioned within the melt so as to controllably introduce different dopants throughout the course of the crystal-growing process.

According to the present invention, the release rate of the dopant is limited by the configuration of the output orifice, i.e., the size and shape of the orifice. As such, the amount of dopant introduced into the melt throughout the course of the crystal-growing process can be precisely controlled such that the concentration of dopant in the melt and, in turn, the concentration of the dopant incorporated into the ingot can be controlled over the length of the ingot, thereby enabling control of the resistivity of the resulting wafers sliced from the ingot. Still further, the dopant delivery apparatus and method can controllably release more or less dopant into the melt during the course of the crystal-growing process if it is desired to change the dopant concentration in the tail portion of the ingot in comparison to the head portion of the ingot. In any event, the dopant delivery apparatus and method of the present invention permits the concentration of dopant incorporated into the ingot to be more precisely controlled.

DETAILED DESCRIPTION OF THE PREFERRED EMBODIMENTS

The present invention now will be described more fully hereinafter with reference to the accompanying drawings, in which preferred embodiments of the invention are shown, this invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

In a typical Czochralski-type semiconductor crystal-growing furnace, a polycrystalline host material, such as silicon, and a measured amount of dopant are melted together in a crucible. The dopant is generally either an n-type or a p-type dopant, such as phosphorus or boron, respectively. Once the melt is prepared, a seed crystal is lowered into contact with the melt to begin the crystal-growing process. As the seed crystal is slowly extracted from the melt, a monocrystalline crystal or ingot is drawn from the melt which incorporates a certain percentage of the dopant. The percentage of dopant incorporated into the ingot depends on the applicable segregation coefficient and other parameters as known to those skilled in the art.

According to some conventional crystal-growing processes, the ingot may incorporate a smaller percentage of dopant than the melt such that the dopant concentration in the melt will gradually increase as the ingot is drawn from the melt. Therefore, an increasingly greater amount of dopant will be incorporated into the ingot as this type of growth process proceeds. Consequently, the resistivity profile of the resulting ingot will vary over its length.

The dopant delivery system and method of the present invention is therefore particularly adapted to overcome the shortcomings of conventional crystal-growing methods by controlling, as a function of time, the delivery of dopant to a melt contained within a melt crucible in a crystal-growing furnace. As explained below, this dopant delivery technique can help to prevent the change in concentration of the dopant in the melt as the ingot is grown. In other words, the controlled delivery of dopant according to the present invention permits continuous doping of the melt over time, thereby controlling the dopant concentration in the melt. By controlling the dopant concentration in the melt, the resistivity profile of the ingot can be precisely controlled, such as by being held more uniform over the length of the ingot or being changed in a controlled fashion over the length of the ingot, thereby generally resulting in a greater usable yield and higher efficiency for a crystal-growing process incorporating the present invention.

Figure 1:
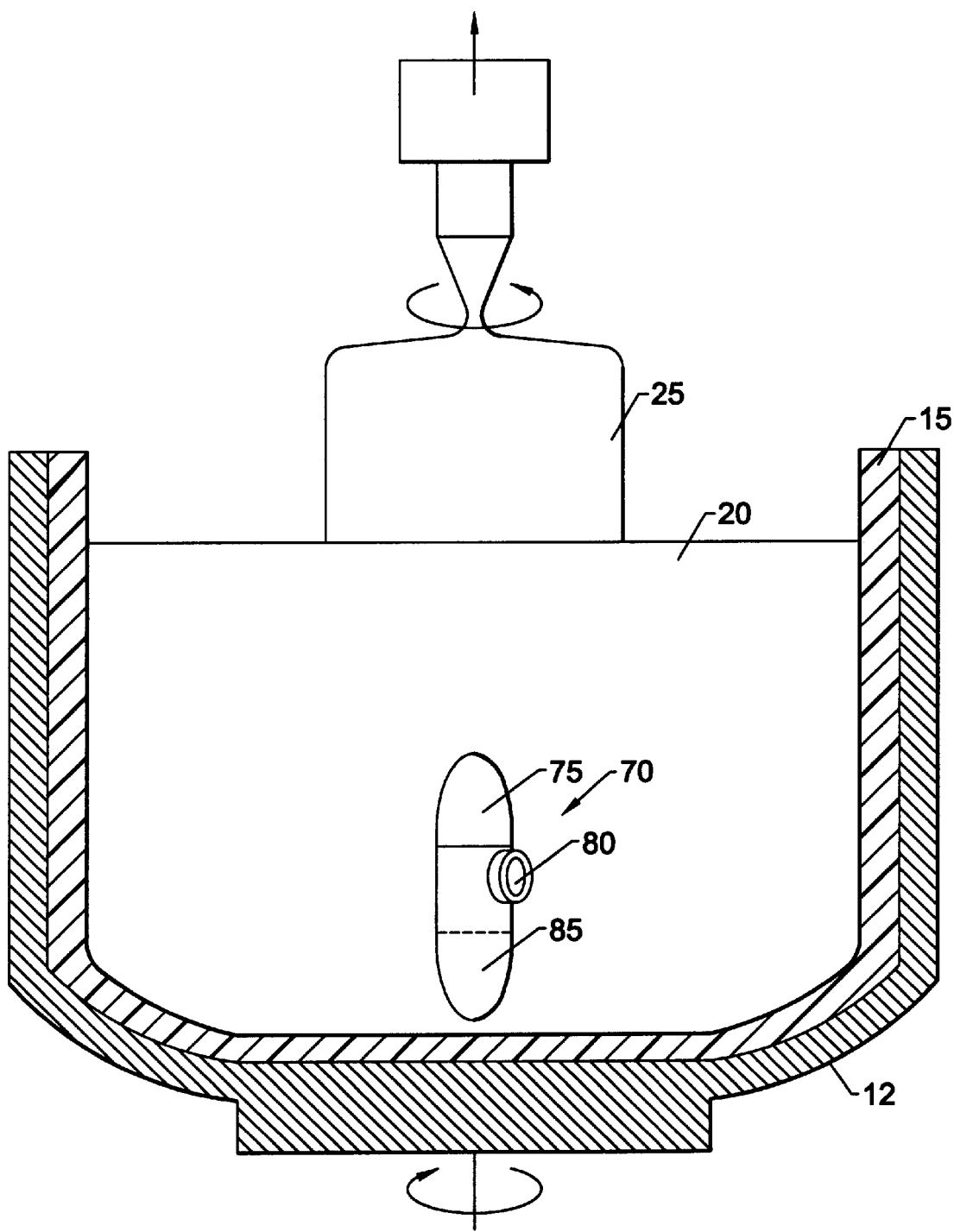
FIG. 1 is a side view of one embodiment of the present invention wherein the dopant delivery system includes a submergible vessel that is fully submerged in the melt.

Referring now to the drawings, FIG. 1 shows one embodiment of the time released dopant delivery system of the present invention, indicated generally by the numeral 70, for controllably delivering dopant to a melt during the course of a crystal-pulling process. A typical Czochralski-type crystal growth furnace includes a susceptor 12, typically formed of graphite, and a crucible 15, typically formed of silicon, seated within the susceptor for containing the melt 20 from which a crystal or ingot 25 is grown. The melt is typically formed by melting a mixture of host material, such as silicon, and a predetermined amount of dopant together in the crucible. The dopant may be any suitable dopant.

Figure 2:
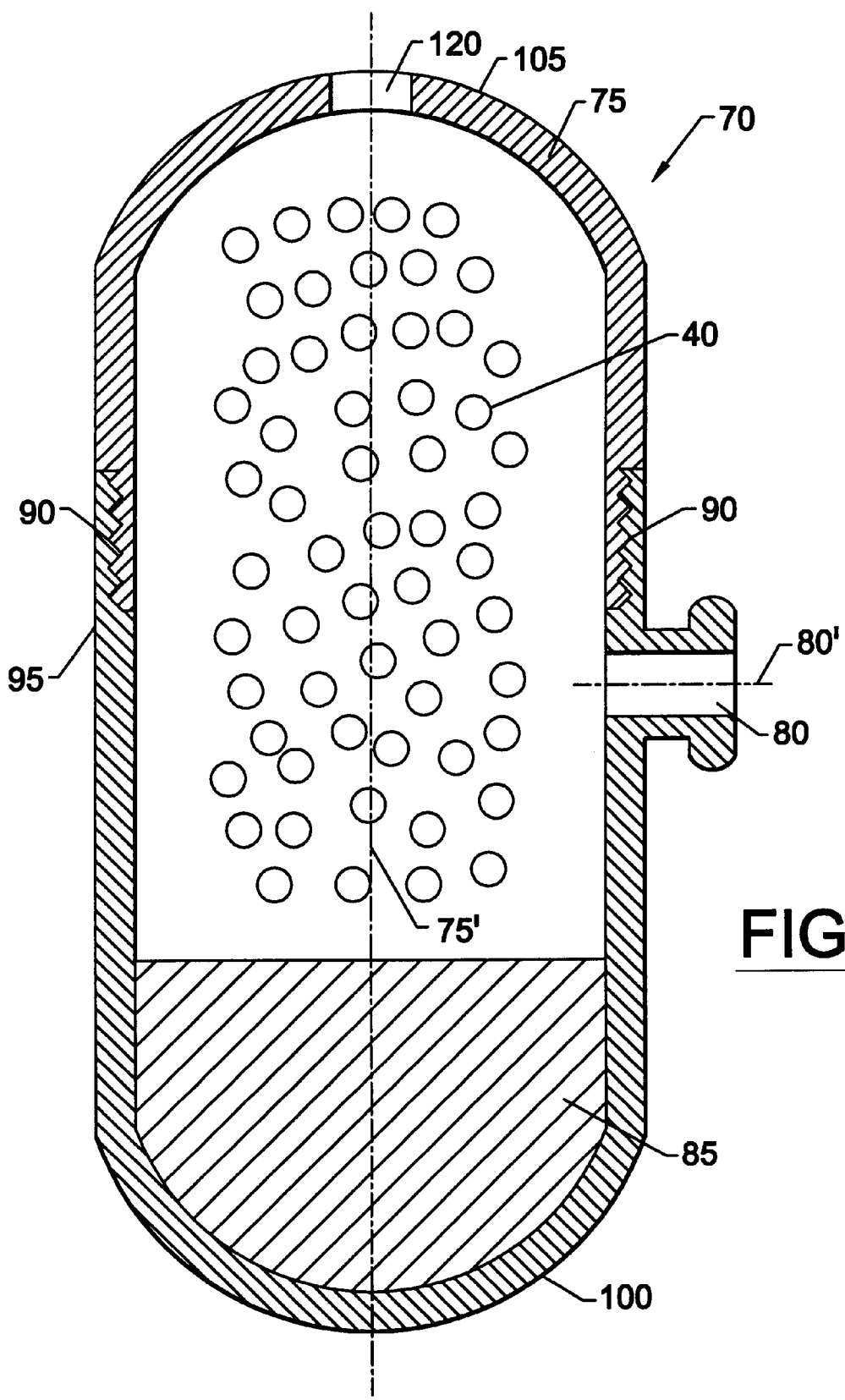
FIG. 2 is a cross-sectional side view of the submergible vessel according to one embodiment of the present invention.

The dopant delivery system 70 of the present invention includes a vessel disposed in the melt that defines an interior cavity for containing a solid dopant. As shown in FIG. 2, the dopant delivery system of one advantageous embodiment includes a submergible vessel 75. That vessel is constructed of a material, such as quartz or any other suitable material, capable of withstanding temperatures greater than the temperature of the melt. According to this embodiment, the dopant delivery system also includes means for submerging the vessel within the melt. For example, the vessel 75 may incorporate the submersion means by being constructed so as to have sufficient weight to sink below the surface of the melt. For instance, the walls of the vessel could be sufficiently thick to provide the required weight or the vessel could contain an internal weight 85. As shown in FIGS. 1 and 2 and as described in more detail below, the vessel also defines an output orifice 80 through which dopant, typically in a molten form, is released into the melt at a release rate limited by the configuration of the output orifice.

Once the vessel 75 is submerged in the melt 20, various factors contribute to facilitate the controlled release of dopant 40 into the melt 20. In particular, the thermal energy of the melt 20, the configuration of the vessel 75, and/or the configuration of the output orifice 80 generally cooperate to control the release of dopant 40 into the melt 20. In this regard, the dopant generally gradually melts as a result of the thermal energy emitted by the melt 20. Alternatively, the vessel 30 may have a built-in source of thermal energy for melting the dopant 40 contained therein. Still further, the vessel may be initially loaded with a molten dopant, but the orifice 80 may be opened, such as by thermal activation, only after properly positioning the vessel with respect to the melt. In any event, once the vessel is properly positioned and the dopant is melted, the dopant 40 will flow through the orifice 80 and into the melt 20, thereby controllably changing the dopant concentration in the melt 20 as a function of time.

The orifice 80 can be defined by a valve or the like to permit the outflow of dopant 40 from the vessel 75 while preventing the flow of the melt 20 into the vessel. Typically, however, the orifice 80 is open so as to allow the passage of the melt 20 into the vessel 75. Once the melt 20 enters the vessel 75 through the orifice 80, the melt liquefies any remaining solid dopant and forms a supersaturated solution of dopant in melt. The supersaturated solution then flows from the vessel 75 and dopes the melt 20 as it is released and remixed with the remainder of the melt 20 in the crucible 15. However, the amount of supersaturated solution and, more particularly, the amount of melted dopant that is released into the melt 20 is limited by the size of the orifice 80, thereby controlling the rate at which the melt is doped.

In a further example, the dopant 40 contained within the vessel 75 could be designed to have specific melting characteristics. For instance, if the mass of solid dopant 40 was a square or rectangular block which was constrained to have only two opposing faces exposed to the thermal energy from the melt 20, the exposed surface area would be constant over time. Thus, the amount of dopant melting at any time would be constant and, as such, the release rate of the dopant 40 from the vessel 75 would be substantially linear. Alternatively, the dopant mass could be stratified, wherein the different strata could have differing densities or different compositions, each exhibiting different melting properties. It should be apparent to one skilled in the art that there are various ways to selectively control the melting properties of a mass, of which the above are illustrations.

In still a further alternative, the vessel 75 may define at least one input orifice, in addition to the output orifice 80, to further facilitate the flow of the melt 20 into the vessel 75. A supersaturated solution of dopant in melt is then formed as described above for release into the melt 20 through the output orifice 80 to dope the remaining melt. The dopant delivery system 70 of the present invention therefore permits additional dopant to be controllably added to the melt during the course of a crystal-pulling process. As such, the dopant delivery system can add more of the same dopant with which the melt is already doped and/or can add other dopant(s), if so desired.

The vessel 75 can have any of a variety of shapes without departing from the spirit and scope of the present invention. As shown in FIGS. 1 and 2, for example, the vessel of one embodiment is a capsular housing having a substantially cylindrical portion 95 with hemispherical closed ends 100 and 105. The dopant delivery system 70 of this embodiment also includes a weight 85 positioned within the vessel. For example, one end of the vessel can be weighted such that the weighted end 100 is biased toward the bottom of the crucible 15 and the vessel 75 stands substantially upright when the vessel is immersed in the melt 20. Formation of the weighted end 100 can be accomplished, for example, by constructing the vessel 75 with a thicker wall at the weighted end 100 or by adding a weight 85 to the vessel 90. As shown, the cylindrical portion 95 of the vessel defines an output orifice 80 while the unweighted end 105 may define a gas escape orifice 120 to release any air trapped in the vessel 75 or gas produced by the melting dopant. Although the orifices can be defined in a variety of locations, the vessel of one advantageous which defines an axis 75' extending though the two opposed closed ends preferably defines the output orifice such that a central axis 80' defined so as to extend through the output orifice is perpendicular to the axis defined by the vessel. In addition, the vessel of this embodiment can define the gas escape orifice 120 so as to be disposed along the axis defined by the vessel.

The vessel 75 can be loaded with dopant 40 in a variety of manners. In the embodiment illustrated in FIG. 2, however, the capsular housing includes first and second portions which can be threadably engaged by respective threaded portions 90. As such, the first and second portions can be separated and filled with dopant. Thereafter, the first and second portions can be threadably connected to form the capsular housing in which the dopant is disposed.

Once submerged in the melt 20, the thermal energy of the melt melts the dopant 40 within the vessel 75 such that a solution supersaturated with dopant is released into the melt 20 through the output orifice 80. At the output orifice, a localized supersaturation of dopant in melt is therefore formed. However, due to the rotation of the crucible 15 and the viscosity of the melt 20, a rotational motion is also imparted to the vessel 75, thereby mixing of the released dopant with the melt 20. As a result, the amount of dopant 40 delivered to the growing ingot 25 can thereby be controlled so as to allow for more precise resistivity characteristics throughout the ingot 25.

Figure 3:
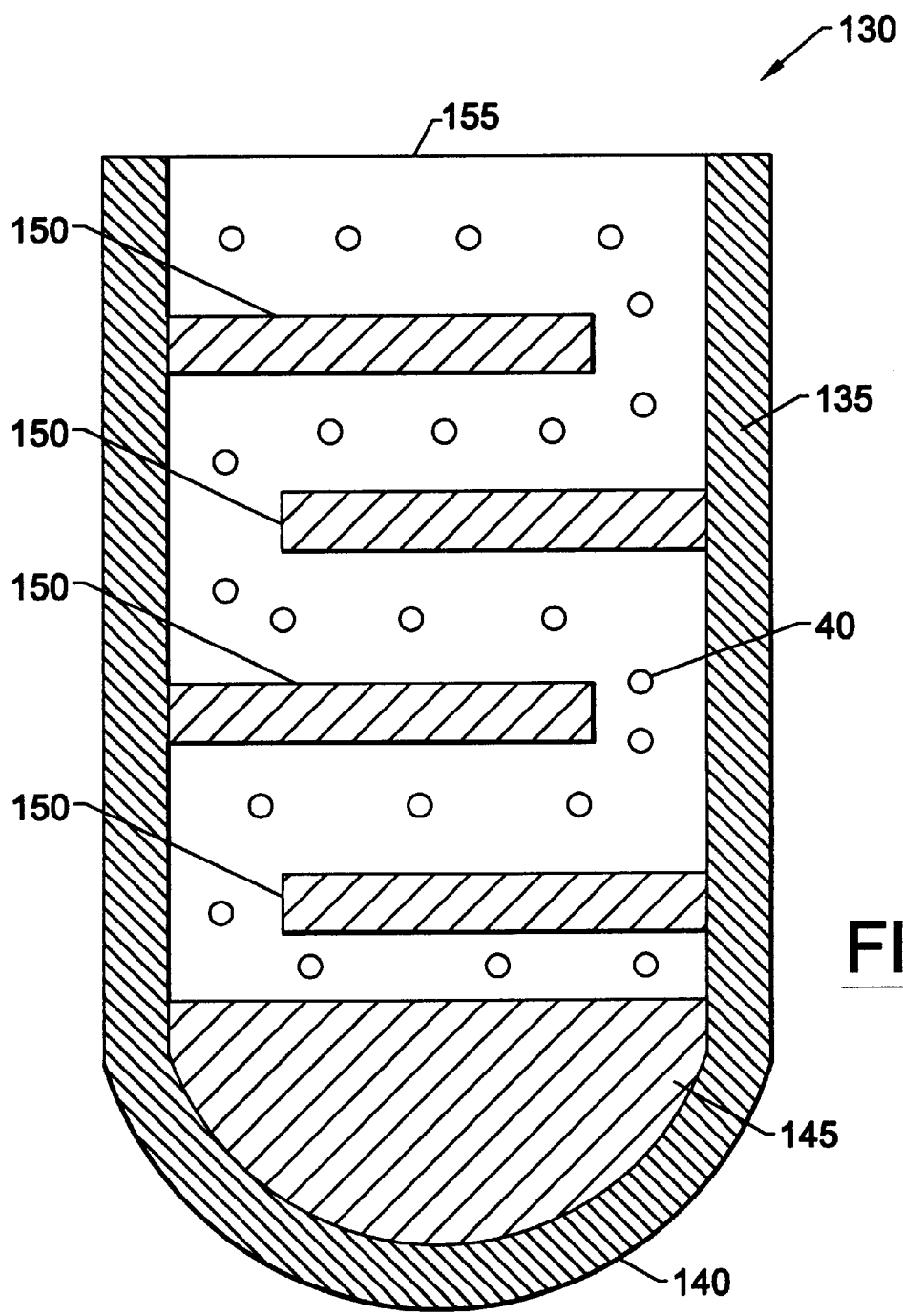
FIG. 3 is a cross-sectional side view of the submergible vessel of an alternative embodiment of the present invention.

Now referring to FIG. 3, an alternate embodiment of the vessel is shown as indicated generally by the numeral 130. In this embodiment, the vessel 130 comprises a cylindrical portion 135 with a single hemispherical closed end 140. The closed end 140 is weighted to bias the vessel 130 into an upright position with the weighted end at the bottom of the crucible 15. Formation of the weighted end 140 can be accomplished, for example, by constructing the vessel 130 with a thicker wall at the weighted end 140 or by adding a separate weight 145 to the vessel 130. The vessel 130 also contains one or more internal baffles 150 affixed to the inner wall of the vessel 130 and extending into the internal cavity. The baffles 150 serve to control the mixing of the dopant 40 with the melt 20. The cylindrical portion 135 further defines an open end 155, opposite the closed end 140, which serves as the output orifice.

Accordingly, when the vessel 130 containing dopant 40 is submerged in the melt 20, a portion of the melt 20 enters the vessel 130 through the open end 155. As with the previous embodiment of the vessel shown in FIG. 2, the rotation of the crucible 15 and the viscosity of the melt 20 impart motion to the submerged vessel 130 while the thermal energy of the melt 20 melts the dopant 40 and forms a localized supersaturated mixture of dopant in melt within the vessel. The baffles 150 in the vessel 130 serve to further mix the dopant 40 and the melt 20. Once the supersaturated mixture forms within the vessel 130, it is released back through the open end 155 of the vessel to mix with the remainder of the melt 20 as described above.

Figure 4:
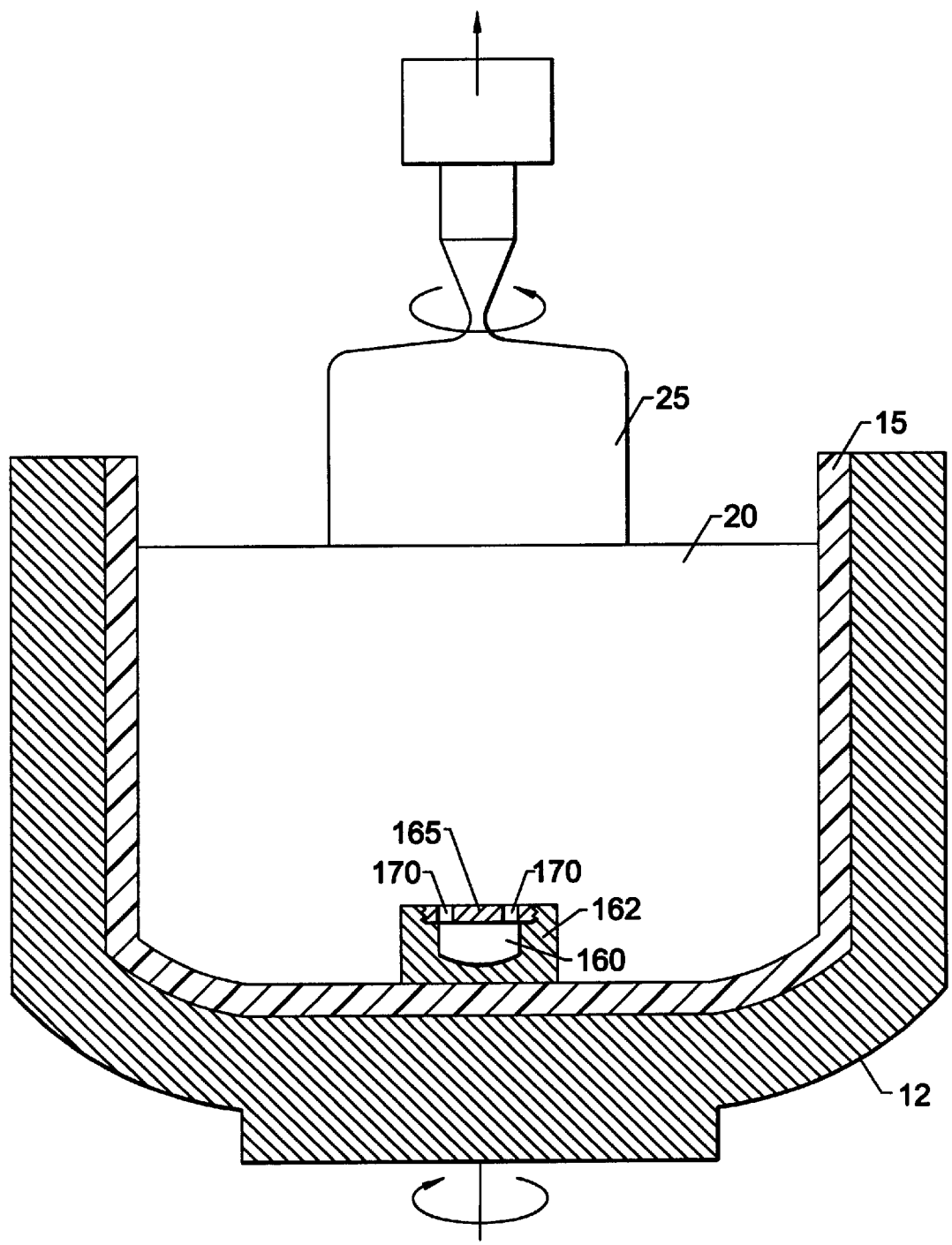
FIG. 4 is a side view of an alternative embodiment of the present invention wherein the melt crucible at least partially defines the vessel.

As shown in FIG. 4, the vessel can be secured within the melt crucible 15. While the vessel can be positioned in different locations within the melt crucible, the vessel of one advantageous embodiment is aligned with the crystal ingot 25 that is drawn from the melt such that the dopant released by the vessel will be evenly distributed throughout the melt relative to the crystal ingot. In the embodiment illustrated in FIG. 4, the vessel 160 is at least partially defined by the melt crucible 15. In particular, the melt crucible of this embodiment can define the generally cup-shaped recess for receiving and storing the dopant. The vessel of this embodiment can also include a lid 165 which covers the portion of the vessel defined by the melt crucible. Typically, the lid is removably connected to the melt crucible, such as by means of a threaded connection or the like, such that the lid can be removed in order to fill the vessel with dopant. As shown, the lid also defines one or more output orifices 170 through which the molten dopant is released. As described above in conjunction with other embodiments of the vessel, the release rate of the dopant is limited by the configuration, i.e., the shape and size, of the output orifices defines by the lid.

Figure 5:
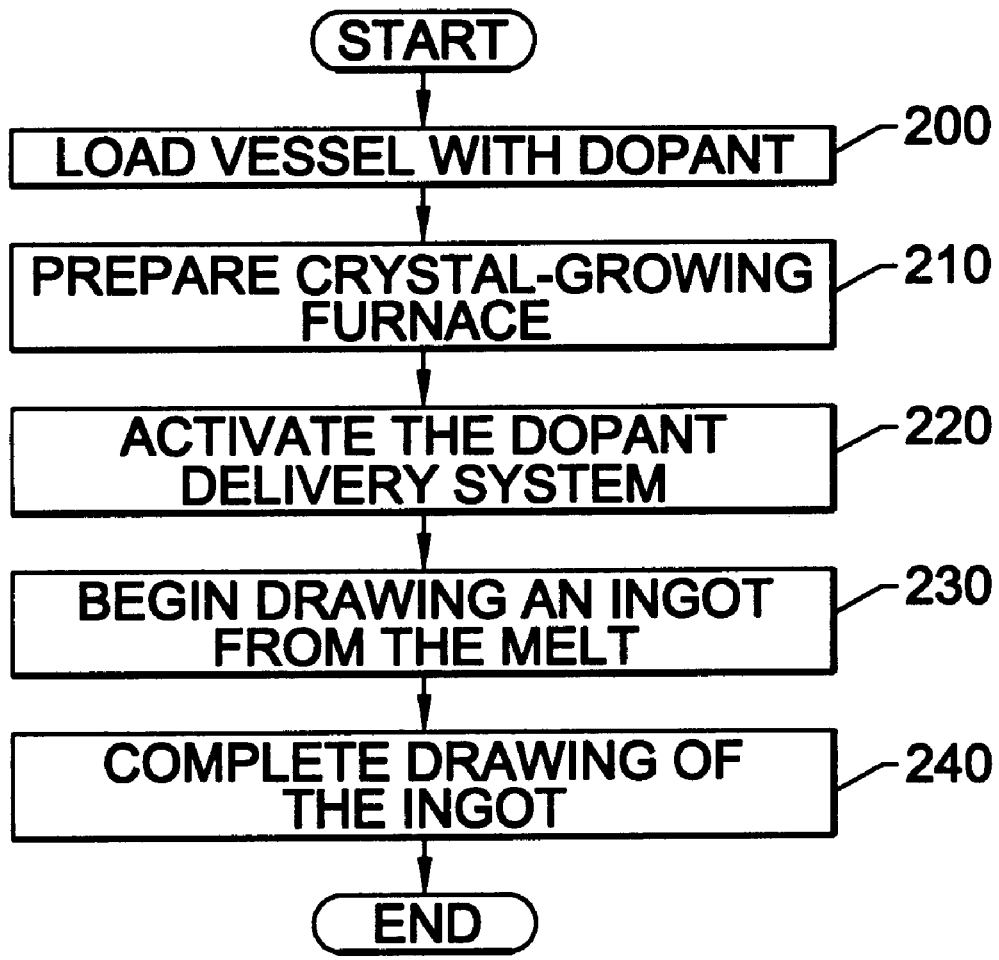
FIG. 5 is a flowchart of the operations performed by the dopant delivery system and method of one embodiment of the present invention.

Now referring to FIG. 5, a flowchart illustrating the operations performed by the dopant delivery system and method of the present invention is shown. Initially, as shown in block 200, the dopant delivery system and, more particularly, the vessel is loaded with the proper dopant for the particular application. As described above, the dopant loaded in the vessel can be either identical to the dopant with which the host material is doped so as to supplement the doping concentration over time or different than the dopant with which the host material is doped so as to controllably dope the resulting ingot with two different dopants.

Once the furnace is prepared as shown in block 210, the next steps, as shown in blocks 220 and 230, are to coordinate the start of the crystal growth process with the activation of the time released dopant delivery system. For example, the dopant delivery system can be immersed within the melt either before or after the seed crystal is lowered into contact with the melt. In instances in which the dopant delivery system is immersed within the melt before the seed crystal is lowered into contact with the melt, the dopant delivery system can be inserted into the melt either after the initial charge has been melted or prior to melting the initial charge. As indicated by FIG. 5, however, the dopant delivery system, such as the submergible vessel, is typically immersed within the melt prior to lowering the seed crystal into contact with the melt and beginning the crystal-growth process. The ingot is then drawn with additional dopant added to the melt by the dopant delivery system and method, as described above. Once the desired ingot is obtained, the ingot pulling process ceases as shown in block 240. By controllably adding dopant throughout the pulling process, the resistivity profile of the ingot can be precisely controlled, such as by being held more uniform over the length of the ingot or being changed in a controlled fashion over the length of the ingot. As such, the dopant delivery apparatus and method of the present invention generally increases the yield and, correspondingly, the efficiency of a crystal-growing process since the resulting ingots will have more precisely tailored properties.

Although the dopant delivery system method of the present invention has been described hereinafter in conjunction with a single vessel for introducing dopant into the melt, the dopant delivery system method of the present invention also contemplates the introduction of two or more vessels into the melt in order to controllably introduce two or more different dopants into the melt throughout the course of the crystal-growing process. As such, the resultant crystal ingot can be controllably doped with multiple dopant, if so desired.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that the modifications and other embodiments are intended to be included within the scope of the appended claims. Although specific terms are employed herein, they are used in a generic and descriptive sense only and not for purposes of limitation.

That which is claimed:

1. A submergible vessel for controllably delivering dopant to a melt contained within a melt crucible in a crystal-growing furnace, comprising:

a housing defining an interior cavity for containing a dopant, wherein said housing also defines at least one orifice through which dopant is released into the melt, wherein the housing comprises a capsule having a substantially cylindrical body and two opposed closed ends, wherein one closed end is weighted such that said capsular housing stands substantially vertical when immersed in the melt; and means for submerging said housing within the melt such that the dopant can be released through the orifice into the melt.

2. A submergible vessel according to claim 1 wherein said capsular housing defines an axis extending through the two opposed closed ends, and wherein said at least one orifice is defined by said cylindrical body of said capsular housing such that a central axis extending through said orifice is perpendicular to the axis defined by said capsular housing.

3. A submergible vessel according to of claim 2 wherein the cylindrical body of the capsular housing further defines a gas escape orifice in the closed end opposite the weighted end and aligned with the axis defined by said capsular housing.

4. A submergible vessel for controllably delivering dopant to a melt contained within a melt crucible in a crystal-growing furnace, comprising:

a housing defining an interior cavity for containing a dopant, wherein said housing also defines at least one orifice through which dopant is released into the melt, wherein the housing comprises a truncated capsule having an open end and an opposed closed end, wherein the closed end is weighted such that said truncated capsular housing stands substantially vertical when immersed in the melt, and wherein said open end serves as said at least one orifice; and means for submerging said housing within the melt such that the dopant can be released through the orifice into the melt.

5. A submergible vessel according to claim 4 wherein the truncated capsular housing comprises baffles affixed to an interior surface thereof and extending into the interior cavity, said baffles controlling the mixing of the melt entering said truncated capsular housing with said dopant contained therein.

6. An apparatus for controllably delivering dopant to a melt in a crystal-growing furnace, comprising:

a crucible containing the melt within the crystal-growing furnace; and a vessel integral with and defined, at least in part, by said crucible so as to be disposed in the melt, said vessel defining an interior cavity for containing a dopant, said vessel also defining at least one output orifice through which dopant is released into the melt.

7. The apparatus of claim 6 wherein said vessel comprises a lid which covers the portion of said vessel defined by said crucible, and wherein said lid defines the at least one output orifice.

8. The apparatus of claim 7 wherein said lid is removably attached to said crucible in order to cover the portion of said vessel defined by said crucible.

9. The apparatus of claim 6 wherein said vessel is defined by a portion of said crucible that is aligned with the crystal drawn from the melt.

10. An apparatus according to claim 6 wherein said vessel comprises baffles affixed to an interior surface thereof and extending into the interior cavity, said baffles controlling the mixing of the melt entering said vessel with the dopant contained therein.

* * * * *